United States Patent
Ma et al.

(10) Patent No.: US 7,333,567 B2
(45) Date of Patent: Feb. 19, 2008

(54) DIGITAL DETECTOR UTILIZABLE IN PROVIDING CLOSED-LOOP GAIN CONTROL IN A TRANSMITTER

(75) Inventors: Zhengxiang Ma, Summit, NJ (US); Mark Y. McKinnon, Morganville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 743 days.

(21) Appl. No.: 10/744,750

(22) Filed: Dec. 23, 2003

(65) Prior Publication Data

US 2005/0135506 A1    Jun. 23, 2005

(51) Int. Cl.
*H04L 27/00* (2006.01)
*H04B 3/46* (2006.01)

(52) U.S. Cl. .................. 375/316; 375/206; 375/228

(58) Field of Classification Search ............. 375/316, 375/206, 228
See application file for complete search history.

(56) References Cited

U.S. PATENT DOCUMENTS

| | | | |
|---|---|---|---|
| 5,491,644 A * | 2/1996 | Pickering et al. ........... 709/226 |
| 5,691,857 A * | 11/1997 | Fitzpatrick et al. ....... 360/77.06 |
| 5,839,100 A * | 11/1998 | Wegener .................... 704/220 |
| 5,881,099 A * | 3/1999 | Takahashi et al. .......... 375/141 |
| 6,259,997 B1 | 7/2001 | Sasho et al. |
| 6,285,717 B1 * | 9/2001 | Bahng et al. ........... 375/240.29 |
| 6,603,810 B1 * | 8/2003 | Bednekoff et al. .......... 375/228 |
| 2002/0015014 A1 * | 2/2002 | Sakashita .................... 345/87 |
| 2002/0158688 A1 | 10/2002 | Terosky et al. |
| 2003/0179040 A1 | 9/2003 | Kossor |
| 2003/0204706 A1 * | 10/2003 | Kim et al. .................. 712/222 |

FOREIGN PATENT DOCUMENTS

EP    04 25 7333    3/2005

OTHER PUBLICATIONS

Analog Devices AD8307 Data Sheet, "Low Cost DC-500 MHz, 92 dB Logarithmic Amplifier," pp. 1-20, 2003.
Analog Devices AD8313 Data Sheet, "0.1 GHz-2.5 GHz, 70 dB Logarithmic Detector/Controller," pp. 1-20, 2003.
Analog Devices AD8361 Data Sheet, "LF to 2.5 GHz TruPwr™ Detector," pp. 1-20, 2003.

* cited by examiner

*Primary Examiner*—Mohammed Ghayour
*Assistant Examiner*—Nurul M Matin

(57) ABSTRACT

A digital detector processes at least one received digital signal to generate a squared signal, encodes the squared signal, applies first and second portions of the encoded signal to a multiplier and a look-up element, respectively, and processes outputs of the multiplier and look-up element to generate a detector output signal representative of a power level of the received digital signal. In an illustrative embodiment, the digital detector is configured so as to exhibit a waveform dependence substantially the same as that of an analog logarithmic amplifier detector. The digital detector and analog logarithmic amplifier detector are utilizable in a closed-loop gain control arrangement for providing a desired gain for a signal path of a base station transmitter in a wireless communication system.

20 Claims, 5 Drawing Sheets

DIGITAL DETECTOR UTILIZABLE IN PROVIDING CLOSED-LOOP GAIN CONTROL IN A TRANSMITTER

FIELD OF THE INVENTION

The present invention relates generally to power detectors, and more particularly to a digital detector utilizable in providing gain control in a transmitter of a wireless communication system or other type of system.

BACKGROUND OF THE INVENTION

A conventional wireless system base station transmitter is typically configured such that the analog radio frequency (RF) path, which generally comprises RF circuitry and a power amplifier, is operating under an open-loop condition. As a result, the gain of the RF path is subject to changes caused by factors such as component variation, temperature and component aging.

One approach to addressing this gain uncertainty problem involves measuring the path gains of a sample set of transmitter elements over temperature to produce a calibration curve that is stored in every transmitter. A given transmitter then uses an on-board temperature sensor and the stored calibration curve to correct for gain drift due to temperature.

Another approach involves calibrating the gain of a given transmitter at base station set up time. However, this approach can typically only ensure that the RF path gain will be within about ±1.5 dB of a desired setting. Although certain commonly-used wireless cellular code division multiple access (CDMA) standards may require only about ±2 dB of accuracy in base station output power level, the uncertainty in RF path gain may nonetheless force the designer to "oversize" the power amplifier in order to avoid violating the out-of-band emission requirements should the gain deviate from the desired setting. Since the power amplifier is generally the single most expensive item in a CDMA base station, and its cost increases with its size, use of oversized power amplifiers significantly increases the total cost of the base station. Moreover, excessive gain variation in the RF path can seriously undermine the effectiveness of baseband predistortion techniques that are commonly utilized to offset power amplifier nonlinearity.

It is therefore apparent that a need exists for an improved approach for controlling gain variations in the RF path of a wireless system transmitter, which avoids one or more of the problems associated with the conventional approaches described above.

SUMMARY OF THE INVENTION

The present invention provides an improved digital detector that is particularly well suited for use in providing closed-loop gain control in a base station transmitter of a wireless communication system.

In accordance with one aspect of the invention, a digital detector processes at least one received digital signal to generate a squared signal, encodes the squared signal, applies first and second portions of the encoded signal to a multiplier and a look-up element, respectively, and processes outputs of the multiplier and look-up element to generate a detector output signal representative of a power level of the received digital signal.

The received digital signals may be first and second digital signals comprising one or more samples of baseband in-phase (I) and quadrature (Q) digital signals, respectively. The encoder may be a floating-point encoder which generates a floating-point number of the form $Y=I^2+Q^2$, the first and second portions of the encoded signal comprising an exponent and a mantissa, respectively, of the floating-point number. The multiplier may be operative to generate a product of a scale factor and the first portion of the encoded signal in order to determine a logarithm of the first portion of the encoded signal. The look-up element may comprise a look-up table utilizable to determine a logarithm of the second portion of the encoded signal. The logarithms generated by the multiplier and look-up element may be summed, and the resulting sums accumulated over multiple samples to provide the detector output signal.

In an illustrative embodiment, the digital detector is configured so as to exhibit a waveform dependence substantially the same as that of an analog logarithmic amplifier detector. The digital detector and analog logarithmic amplifier detector are utilizable in a closed-loop gain control arrangement for providing a desired gain for a signal path of a base station transmitter in a wireless communication system. More specifically, the difference between output signals generated by the two detectors in the illustrative embodiment provides a particularly accurate estimate of the gain from the baseband digital domain to a power amplifier output, in a manner that is independent of the input waveform characteristics.

These and other features and advantages of the present invention will become more apparent from the accompanying drawings and the following detailed description.

DETAILED DESCRIPTION OF THE INVENTION

The present invention will be illustrated below in conjunction with an exemplary digital logarithmic amplifier detector particularly well suited for use in providing closed-loop gain control in a base station transmitter of a wireless communication system. It should be understood, however, that the invention is not limited to use with any particular detector, transmitter or communication system configuration, or any particular gain control application, but is instead more generally applicable to any configuration or application which can benefit from the improved power detection capabilities provided by a digital detector in accordance with the invention.

Figure 1:
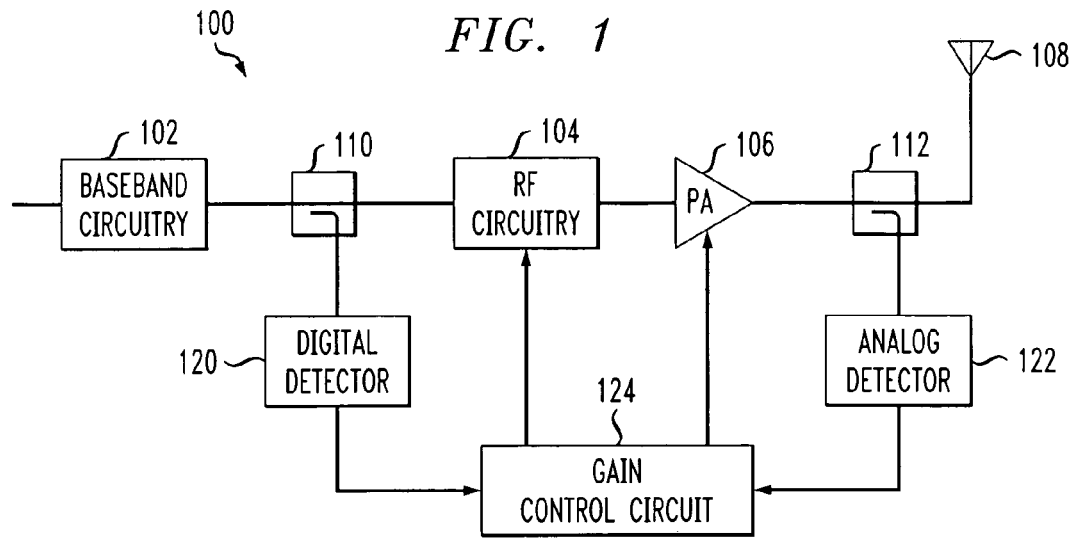
FIG. 1 shows a simplified diagram of a portion of a communication system transmitter in which the present invention is implemented.

FIG. 1 shows a simplified block diagram of a portion of a communication system transmitter 100 in accordance with an illustrative embodiment of the present invention. The transmitter 100 may represent, for example, a base station transmitter in a CDMA system or other type of wireless cellular system.

The transmitter 100 comprises baseband circuitry 102, RF circuitry 104, a power amplifier 106, and an antenna 108. The transmitter further includes first and second couplers 110, 112 associated with respective digital and analog detectors 120, 122, and a gain control circuit 124.

The baseband circuit 102 is operative to generate at least one digital signal in a conventional manner, such as conventional baseband in-phase (I) and quadrature (Q) signals, respectively.

The RF circuitry 104 has an input coupled to an output of the baseband circuitry 102, and is operative to perform operations such as digital-to-analog conversion, modulation, upconversion and filtering.

The power amplifier 106 has an input coupled to an output of the RF circuitry 104, and amplifies an RF signal supplied by the RF circuitry to a level suitable for transmission via antenna 108.

The operation of the baseband circuitry 102, RF circuitry 104, power amplifier 106 and antenna 108 may be substantially the same as that of similar elements in conventional transmitters. The conventional aspects of the operation of these and other elements of the FIG. 1 transmitter are well known to those skilled in the art, and are therefore not described in further detail herein.

The first coupler 110 is connected between an output of the baseband circuitry 102 and an input of the RF circuitry 104, and is configured to couple a portion of the at least one digital signal to an input of the digital detector 120. The digital detector generates an output signal representative of a power level of the at least one digital signal, as will be described in greater detail below in conjunction with FIGS. 5 and 6.

The second coupler 112 is coupled between an output of the power amplifier 106 and an input of the antenna 108, and is configured to couple a portion of an amplified signal from an output of the power amplifier to an input of the analog detector 122. The analog detector generates an output signal representative of a power level of the amplified signal at the output of the power amplifier 106.

The analog detector 122 may comprise, by way of example, a conventional analog logarithmic amplifier detector, also commonly referred to as a log-amp detector or a peak detector. More particular examples of known detectors suitable for use with the present invention include detectors based on the AD8307 logarithmic amplifier or the AD8313 logarithmic detector, both commercially available from Analog Devices, Inc. of Norwood, Mass., USA. However, it should be understood that the invention does not require the use of these or any other particular type of analog detectors. For example, the invention can be implemented using a rectifier as the analog detector.

The output signals of the digital detector 120 and analog detector 122 are supplied as respective first and second input signals to the gain control circuit 124. The gain control circuit processes these input signals to generate one or more gain control outputs that are utilized to control at least one gain control element of an RF path of the transmitter 100. This RF path generally comprises the RF circuitry 104 and the power amplifier 106.

Generally, the gain control circuit 124 is operative to compare the output signal generated by the digital detector 120 with the output signal generated by the analog detector 122 in order to obtain an estimate the gain of the RF path comprising RF circuitry 104 and power amplifier 106. The gain control circuit can then compare this estimate with a desired or target gain for the RF path, and generate gain control output signals as appropriate to adjust the RF path gain such that the estimated gain converges to the target gain. The transmitter 100 thus incorporates a closed-loop gain control capability implemented utilizing a gain control feedback loop comprising 104, 106, 110, 112, 120, 122 and 124. In the illustrative embodiment, the signal at the output of baseband circuitry 102 is a digital signal, and the difference between the detector output signals thus provides an estimate of gain from the baseband digital domain to the output of the power amplifier 106.

The gain control circuit 124 is shown in this illustrative embodiment as generating a plurality of gain control output signals, including an output signal that is supplied to a gain control input of the RF circuitry 104, and another output signal that is supplied to a gain control input of the power amplifier 106. The RF circuitry 104 and power amplifier 106 may each include one or more adjustable gain elements, such as adjustable attenuators, variable gain amplifiers, or other elements which are utilizable to adjust the gain of at least a portion of the RF path responsive to gain control signals. The manner in which such elements may be configured and utilized in providing gain control is well known, and therefore not described in further detail herein. In other embodiments, the gain control circuit 124 may generate only a single gain control output, for application to either the RF circuitry 104, the power amplifier 106, or other suitable adjustable-gain element of the transmitter 100.

Also, other embodiments may place the couplers 110, 112 at different points in a given signal path for which gain control is to be provided. The present invention thus does not require that gain control be provided over any particular type of signal path. It is also possible that other signal detection arrangements may be used, including arrangements which do not rely on couplers. For example, the digital detector 120 may be implemented at least in part in software which runs on a transmitter processor, not explicitly shown in the figure, that is used to implement at least a portion of another transmitter element such as baseband circuitry 102 or gain control circuit 124. In such an arrangement, an actual signal coupler such as coupler 110 will generally not be needed, since the baseband digital signals can be directly processed under software control.

The term "processor" in this context is intended to include, by way of example, a microprocessor, central processing unit (CPU), application-specific integrated circuit (ASIC), field-programmable gate array (FPGA), or other type of digital data processing device, as well as portions or combinations of such devices.

It is to be appreciated that the portion of the transmitter 100 shown in FIG. 1 is considerably simplified for clarity of illustration, and represents an example of one possible configuration of elements that implement an embodiment of the invention. Those skilled in the art will recognize that the digital detection techniques of the invention can be implemented in transmitters having other arrangements of elements.

As noted above, the analog detector 122 in the illustrative embodiment preferably comprises a logarithmic amplifier detector. This is because such detectors have a substantially wider dynamic range than other types of analog detectors, such as root-mean-squared (RMS) power detectors. For example, an RMS power detector known as the AD8361 TruPwr™ detector, commercially available from Analog Devices, Inc., has a dynamic range of only about 15 dB, which may be insufficient for many closed-loop gain control applications. In contrast, the above-mentioned AD8313 logarithmic detector has a dynamic range on the order of 50 dB, which is more than sufficient to provide the desired gain control range of about 35 dB in the illustrative embodiment.

Figure 2A:
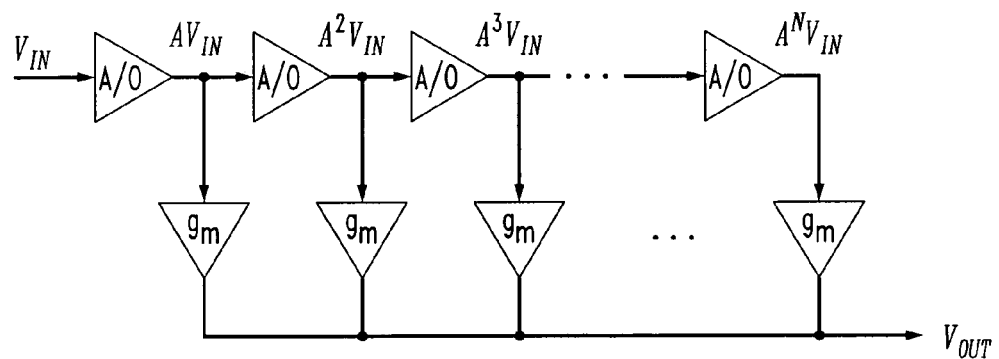
FIG. 2A is a schematic diagram of an exemplary logarithmic amplifier that may be used in an analog detector of the FIG. 1 transmitter.

FIG. 2A shows an example of a logarithmic amplifier 200 that may be used in the analog detector 122 of the transmitter 100 of FIG. 1. The logarithmic amplifier 200 in this example comprises N cascaded stages of limiting amplifiers A/0, and an associated summing circuit which sums the outputs of all of the N stages.

Figure 2B:
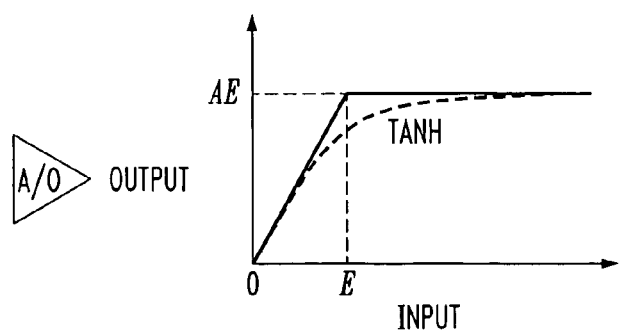
FIG. 2B shows the voltage response of a single limiting amplifier of the logarithmic amplifier of FIG. 2A.

FIG. 2B shows the voltage response of a single limiting amplifier A/0 of the logarithmic amplifier 200 of FIG. 2A. The limiting amplifier has a linear gain A and an input knee voltage E. The straight line plot in the figure shows an idealized voltage response of the limiting amplifier. The actual voltage response is closer to the hyperbolic tangent (TANH) function shown as a dashed curve in the figure.

Assuming an idealized voltage response for each of the N stages, with parameters A and E as shown in FIG. 2B, when the input voltage $V_{IN}$ of the logarithmic amplifier 200 satisfies the following equation:

$$E/A^k < |V_{IN}| \le E/A^{k-1} \quad (1)$$

the first k of the N stages are in linear range, and the rest of the stages are all saturated. The logarithmic amplifier output is then given by:

$$V_{OUT} = g_m \cdot \left( \sum_{n=1}^{k} A^n \cdot |V_{IN}| + (N-k) \cdot E \cdot A \right) \quad (2)$$

$$= g_m \cdot \left( A^k \frac{1 - A^{-k-1}}{1 - A^{-1}} |V_{IN}| + (N-k) \cdot E \cdot A \right)$$

where $g_m$ is the gain of the summing circuit. This response can be approximately described by a logarithm.

Figure 3:
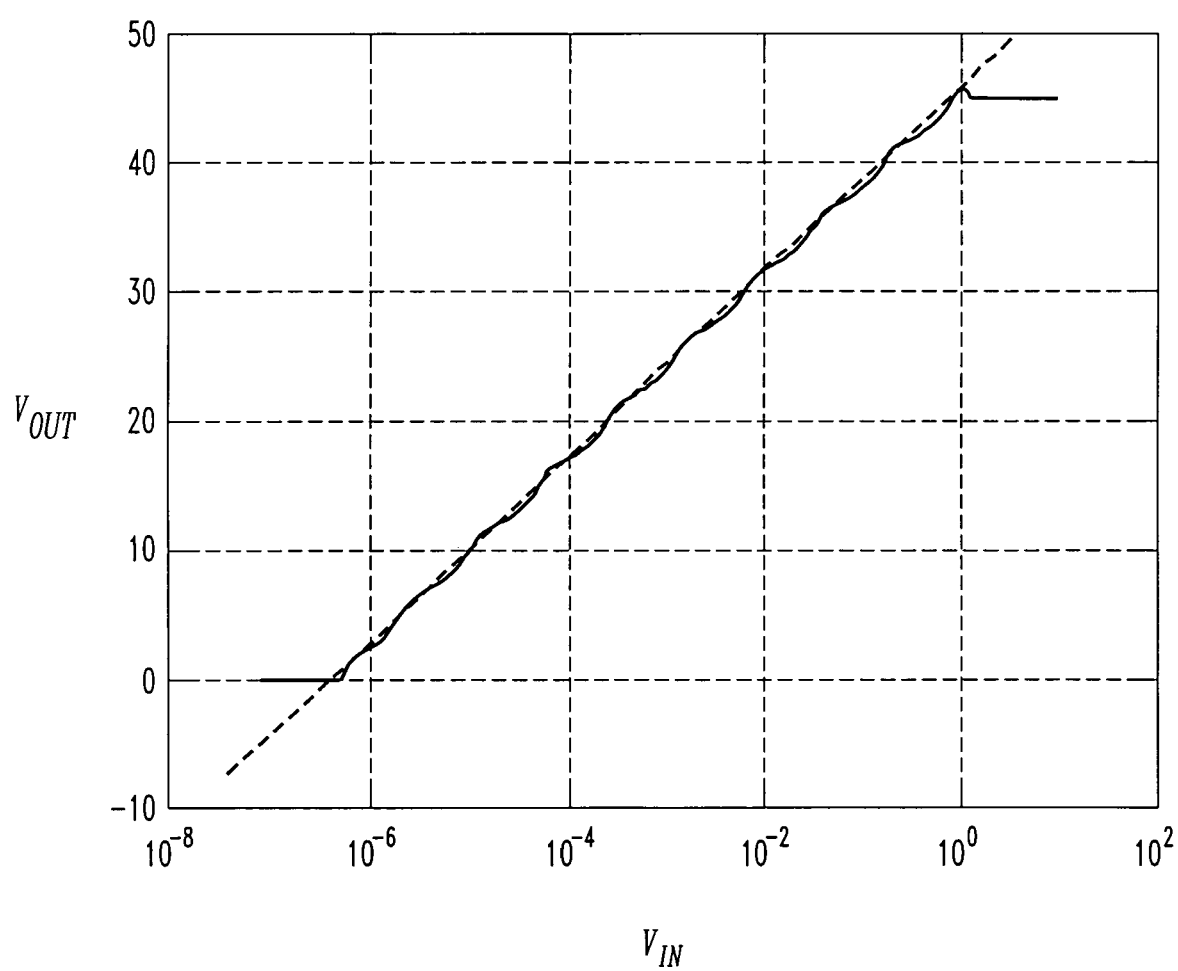
FIG. 3 is a plot of output voltage as a function of input voltage in a particular implementation of the logarithmic amplifier of FIG. 2A.

FIG. 3 plots $V_{OUT}$ versus $V_{IN}$ according to Equation (2), assuming A=5, N=9 and E=1. The straight line in the figure corresponds to an ideal logarithm. Clearly, the relationship between $V_{OUT}$ and $V_{IN}$ is substantially logarithmic over six orders of magnitude, with only a small amount of ripple. Also, the relationship is quite insensitive to the deviation from the idealized limiting behavior for each amplifier stage. In fact, the actual TANH function characteristic of the amplifier stages tends to reduce the ripple.

Therefore, the output voltage $V_{OUT}$ can be related to the input voltage $V_{IN}$ through the following approximation:

$$V_{OUT} = V_Y \log(|V_{IN}|/V_X) \quad (3)$$

where $V_Y$ is referred to as the slope voltage, and $V_X$ is referred to as the intercept voltage. After filtering, the logarithmic amplifier 200 produces a direct current (DC) voltage output, which is logarithmically related to the average RMS power of the input signal. However, from Equation (3), it is apparent that the logarithmic amplifier output is not an RMS power measurement in dB. A true RMS power measurement in dB requires the output to be proportional to the logarithm of an average of the input voltage squared, as shown in the following equation:

$$P_{RMS} \propto \log(\text{avg}(|V_{IN}|^2)) \quad (4)$$

Instead, the filtered output of a logarithmic amplifier is proportional to an average of the logarithm of the input voltage:

$$P_{log-amp} \propto \text{avg}(\log(|V_{IN}|)) \quad (5)$$

This subtle difference causes the logarithmic amplifier output to be dependent on the amplitude distribution of the input waveform. For example, a CDMA waveform with large peak-to-average ratio (PAR) and a single-tone sine wave will produce different readings from the logarithmic amplifier, even though they have the same average RMS power. This will generally not cause any problem in single carrier systems where the signal modulation has constant amplitude distribution, such as global system for mobile communication (GSM) or IS-136 time division multiple access (TDMA) systems. In such systems, as soon as the logarithmic amplifier is calibrated at a few different power levels to extract the slope and intercept parameters, the logarithmic amplifier output would be an accurate measure of the average RMS power in dB. But with CDMA systems, the amplitude distribution changes with the traffic condition. For WCDMA, when there is only pilot, the PAR is about 6 dB, but a fully-loaded carrier has a PAR of about 10 dB.

Figure 4:
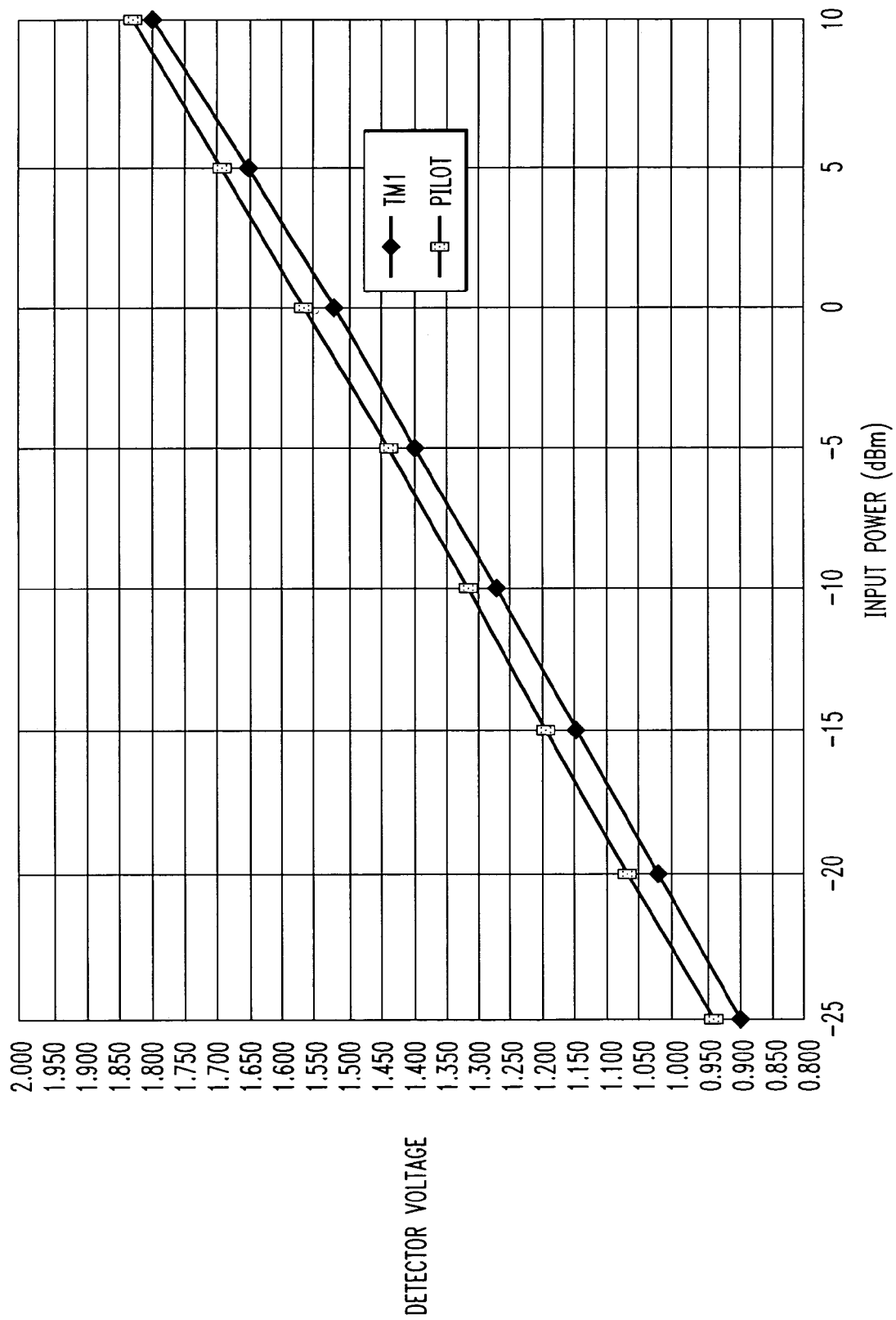
FIG. 4 is a plot of detector voltage as a function of input power for an example analog detector that may be utilized in the FIG. 1 transmitter, for two different types of wideband CDMA (WCDMA) signals.

FIG. 4 shows a plot of detector voltage as a function of input power for the above-mentioned AD8313 analog logarithmic amplifier detector, for two different types of WCDMA input signals, namely, a Test Model 1 (TM1) heavy traffic signal, and a pilot signal. As shown in the figure, the responses of the example analog logarithmic amplifier detector to the two different input signal waveforms have the same slope but different offsets. For a given detector voltage reading, there is a difference of up to about 2 dB in actual input power level between the two waveforms. Thus, unless this effect is taken into account, a conventional logarithmic amplifier detector fails to provide the desired level of accuracy for implementation of closed-loop gain control in a WCDMA base station transmitter.

The present invention in the illustrative embodiment overcomes this problem associated with use of a conventional analog logarithmic amplifier detector by implementing a gain control feedback loop which includes the digital detector 120 arranged as shown in FIG. 1. More specifically, the digital detector 120 is configured such that it mimics the behavior of the analog logarithmic amplifier detector. Both detectors thus have substantially the same waveform dependence in the illustrative embodiment. As noted above, the difference between the output signals generated by the two detectors 120, 122 provides an estimate of the gain from the baseband digital domain to the output of the power amplifier 106, independent of the input waveform characteristics. The gain control circuit 124 is therefore able to determine the gain of the RF path in a manner that takes the waveform dependence of the analog detector into account, and as a result the desired level of gain control accuracy is provided, even in WCDMA applications.

Figure 5:
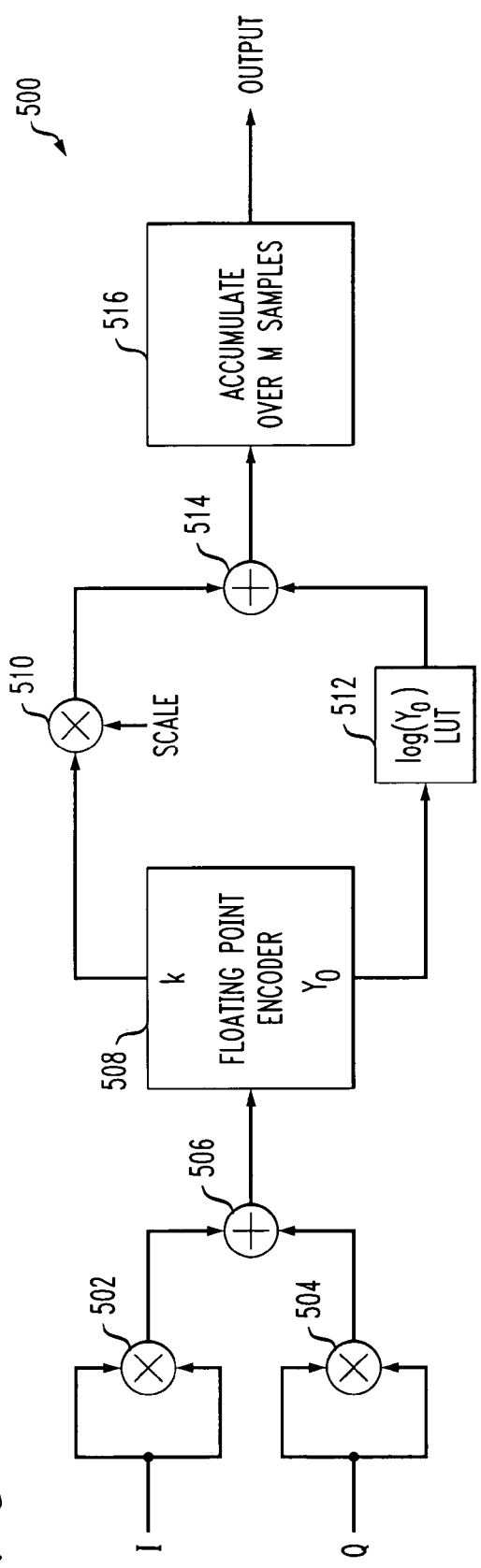
FIG. 5 is a schematic diagram of an illustrative embodiment of a digital detector utilizable in the FIG. 1 transmitter.

FIG. 5 shows one possible embodiment of a digital detector 500 that may be utilized as the digital detector 120 in transmitter 100 of FIG. 1. As noted above, the digital detector may be implemented at least in part in software running on a processor of the transmitter 100, with the processor comprising, for example, a microprocessor, CPU, ASIC, FPGA or other type of digital data processing device, as well as portions or combinations of such devices.

The digital detector 500 includes a first signal processing element illustratively implemented as a squaring element comprising multipliers 502, 504 and summing element 506. The first signal processing element is configured to receive at least one digital signal, and in this implementation receives first and second digital signals comprising baseband in-phase (I) and quadrature (Q) signals, respectively. The multipliers 502 and 504 are configured to square the respective I and Q signals, and the summing element 506 sums the squares of the first and second digital signals. The resulting signal, corresponding to $I^2+Q^2$, is an example of what is more generally referred to herein as a "squared signal," although the invention does not require this particular squared signal format. Other types of squared signals, including more or fewer squared components, and with or without the application of summing or other signal processing operations to such components, may be used in alternative embodiments.

The output of the summing element 506 is applied to an input of an encoder illustratively implemented as floating-point encoder 508. The floating-point encoder generates an N-bit floating-point number $Y=I^2+Q^2$, with a first output of the encoder specifying an exponent k of the N-bit floating-point number, and the second output of the encoder specifying a mantissa $Y_0$ of the N-bit floating-point number. It should be noted that use of the variable k in this context to denote the exponent of the floating-point number is unrelated to the use of k elsewhere herein to denote the number of amplifier stages in linear range.

Figure 6:
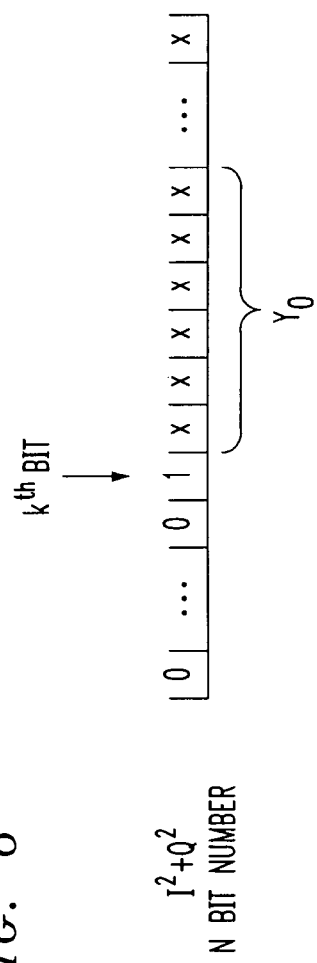
FIG. 6 illustrates the operation of the floating-point encoder of the digital detector of FIG. 5.

FIG. 6 shows the format of the N-bit number $Y=I^2+Q^2$, representative of the squared and summed I and Q signals, as generated by the floating-point encoder 508. As shown, the exponent k denotes a most significant non-zero bit of the N-bit number, corresponding to a kth bit thereof, while the mantissa $Y_0$ denotes a number of bits that are less significant than the kth bit. In this particular example, $Y_0$ is shown as denoting six bits following the kth bit.

Referring again to FIG. 5, the digital detector 500 further includes a multiplier 510 and a look-up element illustratively implemented as a look-up table 512. The multiplier 510 has an input coupled to the first output of the floating-point encoder 508, and the look-up table 512 has an input coupled to the second output of the floating-point encoder 508. The multiplier 510 computes the logarithm of the exponent k by multiplying k by an appropriate scaling factor, while the logarithm of the mantissa $Y_0$ is determined utilizing the look-up table 512. More specifically, the six bits of the mantissa $Y_0$ in this example are used as an index into a look-up table comprising a total of 64 entries. Other types of floating-point number formats and look-up table arrangements may be used in alternative embodiments.

Also included in the digital detector 500 is a second signal processing element configured to process outputs of the multiplier 510 and the look-up table 512 to generate a detector output signal representative of a power level of the input digital I and Q signals. The second signal processing element is illustratively implemented as a summing element 514 having first and second inputs coupled to respective outputs of the multiplier 510 and the look-up table 512, and an accumulator 516 having an input coupled to an output of the summing element 514. The accumulator 516 is operative to accumulate output signal values generated by the summing element 514 over multiple samples of the input I and Q signals.

It should be noted that one or more of the first and second signal processing elements, the encoder, the multiplier and the look-up element of the digital detector 500 may be implemented at least in part in software running on a processor of the transmitter 100. The same set of hardware may thus be used to implement multiple ones of the distinct elements shown in the figure. Also, other types of signal processing elements may be used in implementing a digital detector in accordance with the invention.

The operation of the digital detector 500 in the illustrative embodiment of the invention will now be described in greater detail. For each of a plurality of samples of the I and Q input signals, the power $I^2+Q^2$ is calculated utilizing elements 502, 504 and 506. Then the logarithm of the power is calculated and accumulated over a specific number of samples or other designated period of time, utilizing elements 508, 510, 512, 514 and 516.

Use of a floating-point technique to calculate the logarithm is preferred in that it provides good accuracy over a large dynamic range, although other techniques can be used in alternative embodiments of the invention. As indicated previously, the encoder 508 encodes the power as an N-bit floating-point number comprising an exponent k and a mantissa $Y_0$, with the logarithms of the exponent and mantissa being determined by the respective multiplier 510 and look-up table 512. The logarithm of the N-bit floating-point number is given by the sum of the logarithms of the exponent and mantissa, as generated by the summing element 514.

Assuming that the kth bit of the N-bit floating-point number $Y=I^2+Q^2$ is the most significant non-zero bit, with the least significant bit being the zeroth bit, and that the mantissa $Y_0$ is supplied as an index to the look-up table 512 as a p-bit number, then the output of the digital detector 500 is given by:

$$C \cdot \log(Y) = C \cdot \log(2^k \cdot (1 + Y_0/2^p)) \qquad (6)$$
$$= C \cdot \log(2) \cdot k + C \cdot \log(1 + Y_0/2^p)$$

where C is a constant and determines the slope of the digital detector. It is advantageous to choose C such that the scaling for the exponent k in multiplier 510 becomes simply a shifting operation. The second term in Equation (6) represents the look-up table operation. The index to the look-up table is the mantissa $Y_0$ and the content of the look-up table is given by:

$$\text{round}(C \cdot \log(1 + Y_0/2^p)). \qquad (7)$$

The constant C is also preferably large enough such that the available width of the look-up table 512 is fully utilized. The accuracy of the logarithm depends on the number of bits utilized for $Y_0$ and p, as well as the bit-width q of the look-up table entries. The accuracy limitation attributable to p in dB is given by:

$$\pm 10 \cdot \log(1 + 2^{-p-1}) \text{dB} \qquad (8)$$

and attributable to the bit-width q of the look-up table entries is given by:

$$\pm 3 \cdot 2^{-q} \text{ dB}. \qquad (9)$$

Thus, a 64-entry, 8-bit wide look-up table would give better than ±0.04 dB accuracy, which is sufficient for the closed-loop gain control application of the illustrative embodiment.

Other types of look-up tables or other look-up elements could be used in implementing the invention.

Figure 7:
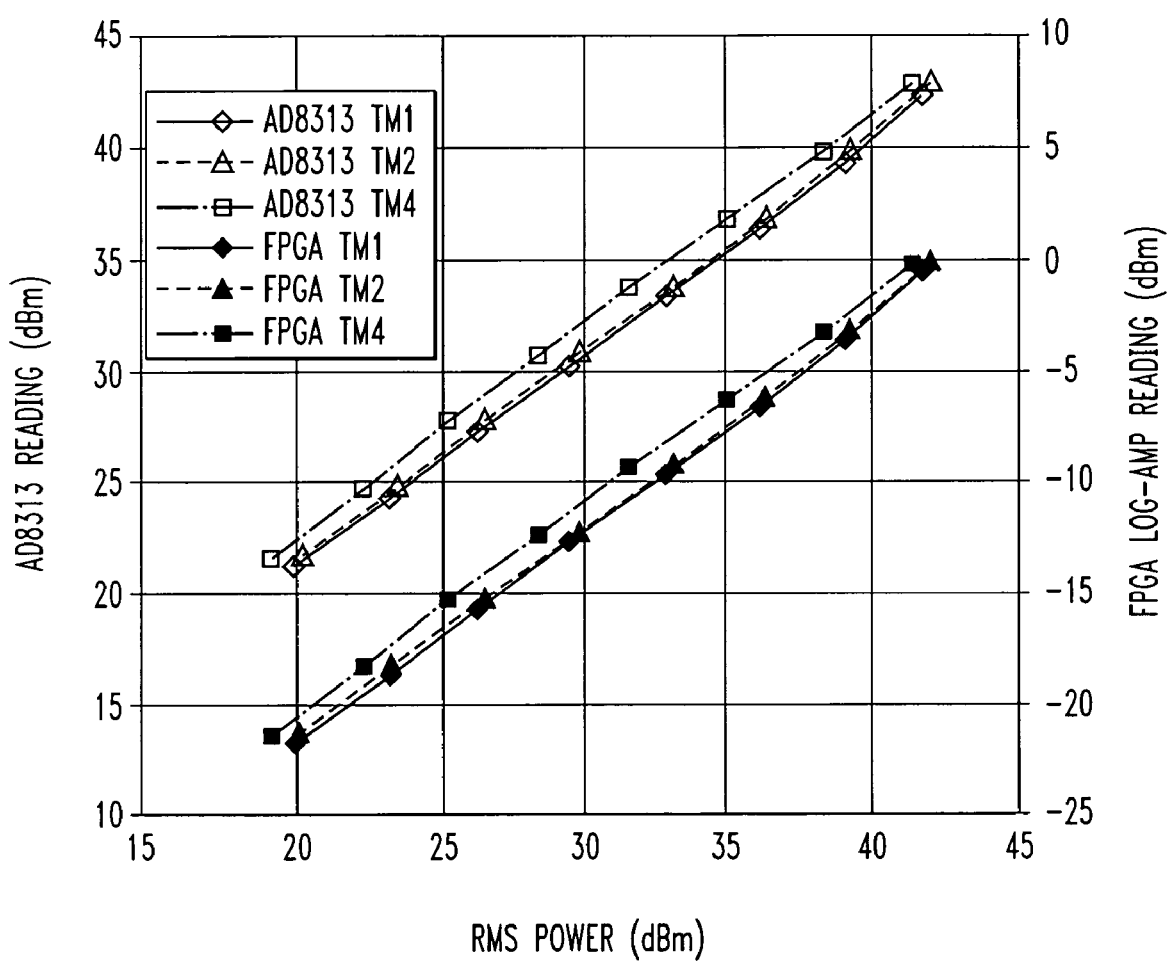
FIG. 7 is a plot of detector reading as a function of RMS power, for example implementations of the analog and digital detectors of the FIG. 1 transmitter, utilizing a number of different types of WCDMA signals.

FIG. 7 is a plot of detector reading as a function of RMS power, for example implementations of the analog and digital detectors of the FIG. 1 transmitter, utilizing a number of different types of WCDMA signals. The analog detector is the conventional AD8313 analog logarithmic amplifier detector previously mentioned herein.

It can be seen from the figure that for the different waveforms, the analog detector shows different offset but the same slope, just as in the FIG. 4 example. However, the digital detector also shows substantially the same waveform dependence. Thus the difference between the readings of the two detector is independent of waveform, and the detectors can be used to accurately measure the gain of a signal path of the transmitter in the manner previously described.

As indicated previously, the use of a logarithmic-amplifier analog detector is not a requirement of the invention. The invention can be implemented using other types of analog detectors, such as a rectifier. The digital detector as described above can be modified in a straightforward manner so as to be matched to these and other types of analog detectors. For example, if the analog detector comprises a rectifier, then the digital detector can be modified to determine the square root of $I^2+Q^2$ rather than the logarithm of $I^2+Q^2$. A wide variety of other types of analog and digital detector implementations may be used in conjunction with the present invention.

The above-described embodiments of the invention are intended to be illustrative only. For example, as indicated above, the placement of the detectors relative to the transmitter elements may be varied in alternative embodiments. Also, the particular elements of the FIG. 1 transmitter and the FIG. 5 digital detector in the illustrative embodiments should not be viewed as requirements of the invention, and numerous alternative arrangements may be utilized. In addition, the digital detection and gain control techniques of the invention can be implemented in hardware, software, firmware or combinations thereof. Furthermore, the particular assumptions made herein in conjunction with describing the illustrative embodiments should be viewed as exemplary in nature, and need not apply in other embodiments. These and numerous other alternative embodiments within the scope of the following claims will be readily apparent to those skilled in the art.

We claim:

1. A digital detector comprising:
a first signal processing element configured to receive at least one digital signal and to generate a squared signal therefrom;
an encoder having an input coupled to an output of the first signal processing element, and operative to generate an encoded signal from the squared signal;
a multiplier and a look-up element, the multiplier and the look-up element receiving respective first and second portions of the encoded signal; and
a second signal processing element configured to process outputs of the multiplier and the look-up element to generate a detector output signal representative of a power level of the at least one digital signal.

2. The digital detector of claim 1 wherein the first signal processing element comprises at least one squaring element.

3. The digital detector of claim 2 wherein the first signal processing element comprises a first squaring element for squaring a first digital signal, a second squaring element for squaring a second digital signal, and a summing element for summing the squares of the first and second digital signals.

4. The digital detector of claim 3 wherein the first and second digital signals comprise one or more samples of baseband in-phase (I) and quadrature (Q) digital signals, respectively.

5. The digital detector of claim 1 wherein the encoder comprises a floating-point encoder, the first and second portions of the encoded signal corresponding to respective first and second portions of a floating-point number.

6. The digital detector of claim 5 wherein the encoder generates an N-bit floating-point number, a first output of the encoder corresponding to the first portion of the floating-point number and coupled to an input of the multiplier is representative of an exponent of the floating-point number, and a second output of the encoder corresponding to the second portion of the floating-point number and coupled to an input of the look-up element is representative of a mantissa of the floating-point number.

7. The digital detector of claim 5 wherein the floating-point number comprises a number of the form $Y=I^2+Q^2$, where I and Q denote respective baseband in-phase and quadrature digital signals received by the first signal processing element.

8. The digital detector of claim 1 wherein the multiplier is operative to generate a product of a scale factor and the first portion of the encoded signal in order to determine a logarithm of the first portion of the encoded signal.

9. The digital detector of claim 1 wherein the look-up element comprises a look-up table utilizable to determine a logarithm of the second portion of the encoded signal.

10. The digital detector of claim 1 wherein the second signal processing element comprises:
a summing element having first and second inputs coupled to respective outputs of the multiplier and the look-up element; and
an accumulator having an input coupled to an output of the summing element, the accumulator being operative to accumulate output signal values generated by the summing element over multiple samples of the at least one digital signal.

11. The digital detector of claim 1 wherein the detector output signal representative of a power level of the at least one digital signal is of the form:

$$C \cdot \log(Y) = C \cdot \log(2^k \cdot (1 + Y_0/2^p))$$
$$= C \cdot \log(2) \cdot k + C \cdot \log(1 + Y_0/2^p)$$

where Y is an N-bit floating-point number corresponding to the encoded signal generated by the encoder, k is a most significant non-zero bit of Y and represents an exponent of the floating-point number, p denotes a number of bits in a mantissa $Y_0$ of the floating-point number, and C is a constant specifying a slope of the digital detector.

12. The digital detector of claim 1 wherein the digital detector is configured to generate an output signal representative of a root-mean-squared (RMS) power level of the at least one digital signal.

13. The digital detector of claim 1 wherein the digital detector is configured so as to exhibit a waveform dependence substantially the same as that of an analog logarithmic amplifier detector.

14. The digital detector of claim 1 wherein one or more of the first and second signal processing elements, the encoder, the multiplier and the look-up element are implemented at least in part in software running on a processor.

15. The digital detector of claim 14 wherein the processor comprises a baseband processor of a base station transmitter in a wireless communication system.

16. A transmitter comprising a gain control feedback loop incorporating the digital detector of claim 1.

17. The transmitter of claim 16 wherein the transmitter comprises a base station transmitter in a wireless communication system.

18. The transmitter of claim 16 wherein the transmitter comprises:
   baseband circuitry operative to generate the at least one digital signal;
   radio frequency circuitry having an input coupled to an output of the baseband circuitry;
   a power amplifier having an input coupled to an output of the radio frequency circuitry;
   an analog detector;
   a coupler configured to couple a portion of an amplified signal from an output of the power amplifier to an input of the analog detector; and
   a gain control circuit;
   the output signal of the digital detector being supplied as a first input to the gain control circuit, the analog detector generating an output signal that is supplied as a second input to the gain control circuit, the gain control circuit generating a gain control output utilized to control at least one gain control element of a radio frequency path comprising the radio frequency circuitry and the power amplifier.

19. A method for use in a digital detector, the method comprising the steps of:
   generating a squared signal from at least one received digital signal;
   encoding the squared signal;
   applying first and second portions of the encoded signal to a multiplier and a look-up element, respectively; and
   generating a detector output signal representative of a power level of the received digital signal, utilizing outputs of the multiplier and look-up element.

20. An article of manufacture comprising a machine-readable storage medium for storing one or more programs for use in implementing at least a portion of a digital detector, wherein the one or more programs when executed perform the steps of:
   generating a squared signal from at least one received digital signal;
   encoding the squared signal;
   applying first and second portions of the encoded signal to a multiplier and a look-up element, respectively; and
   generating a detector output signal representative of a power level of the received digital signal, utilizing outputs of the multiplier and look-up element.

* * * * *